(12) United States Patent
Jeon

(10) Patent No.: US 7,400,182 B2
(45) Date of Patent: Jul. 15, 2008

(54) CLOCK GENERATOR WITH ONE POLE AND METHOD FOR GENERATING A CLOCK

(75) Inventor: Phil-Jae Jeon, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 721 days.

(21) Appl. No.: 10/915,746

(22) Filed: Aug. 11, 2004

(65) Prior Publication Data

US 2005/0040876 A1 Feb. 24, 2005

(30) Foreign Application Priority Data

Aug. 13, 2003 (KR) .................. 10-2003-0056145

(51) Int. Cl.
*H03L 7/06* (2006.01)
(52) U.S. Cl. .................. 327/156; 327/163
(58) Field of Classification Search ......... 327/147–150, 327/156–159, 163
See application file for complete search history.

(56) References Cited

U.S. PATENT DOCUMENTS 6,201,424 B1 3/2001 Harrison .................. 327/159
6,463,112 B1 10/2002 Hafez et al. .................. 375/376
6,794,945 B2 * 9/2004 McDonald et al. .......... 331/1 A
6,888,412 B2 * 5/2005 Kim et al. .................. 331/1 A

FOREIGN PATENT DOCUMENTS

JP 11-234122 8/1999

* cited by examiner

*Primary Examiner*—N. Drew Richards
*Assistant Examiner*—William Hernandez
(74) *Attorney, Agent, or Firm*—Mills & Onello LLP

(57) ABSTRACT

A clock generator based on a phase-locked loop with one pole and an improved period jitter characteristic is disclosed. The clock generator comprises a phase detector for generating a phase detection signal and a phase error signal, a charge pump for generating a loop control voltage, a loop filter for generating an integrated voltage signal, a voltage-controlled oscillator for generating multi-phase output signals, and a phase error compensating circuit for compensating a phase error generated at a prior input clock. The clock generator has an improved period jitter characteristic by compensating a phase error generated at a prior input clock.

12 Claims, 6 Drawing Sheets

CLOCK GENERATOR WITH ONE POLE AND METHOD FOR GENERATING A CLOCK

CROSS REFERENCE TO RELATED APPLICATIONS

This application claims priority from Korean Patent Application No. 2003-56145, filed on Aug. 13, 2003, the contents of which are incorporated herein by reference in their entirety.

BACKGROUND OF THE INVENTION

1. Field of the Invention

The present invention relates to a clock generator having a phase-locked-loop (PLL) and a method of generating a clock, and more particularly to a PLL-based clock generator with one pole that is able to improve a period jitter characteristic and a method of generating a clock using the same.

2. Related Art

A clock generator is a device that provides a clock signal to various digital systems. FIG. 1 is a schematic block diagram which illustrates a conventional PLL-based clock generator using a voltage-controlled oscillator (VCO) 40. Referring to FIG. 1, the output of the VCO 40 is sampled in a sampler 50 and changed to a signal FFEED having a low frequency in a divider 60. The signal FFEED is applied to a phase detector 10. The output signal PDET from the phase detector 10 is applied to a charge pump 20, which generates a signal LCV, which is applied to a loop filter 30. The output of the loop filter is applied to the VCO 40, and the output of the VCO PCLK is fed back through the sampler 50 and the divider 60 to an input terminal of the phase detector 10. The output signal FFEED of the divider 60 is inputted to one input terminal of the phase detector 10. The clock input signal FIN is inputted to another input terminal of the phase detector 10. The output of the phase detector 10 is changed to a loop control signal LCV, and is inputted to the loop filter 30. The loop filter 30 sets a bandwidth of the circuit, and the output of the loop filter 30 is inputted to an input terminal of the VCO 40.

The conventional clock generator shown in FIG. 1 has two poles. One of the two poles is generated by a capacitor (not shown) in the loop filter 30, and the other is generated at the output of the VCO 40.

The 2-pole system is unstable, and needs to be stabilized by adding a zero in the loop filter 30. However, stabilizing the system using this method may deteriorate the period jitter characteristic of the circuit.

There are two methods for preventing the deterioration of the period jitter characteristic. One is to design a clock generator based on a delay-locked loop (DLL), and the other is to design a clock generator based on PLL of which the cycling nature is compensated.

Referring to FIG. 1, the pole generated by the loop filter 30 is necessary to change the ac signal to dc signal and control the VCO 40. The pole at the output terminal of the VCO 40 is generated because the frequency of the output of the VCO 40 is compared in the phase detector 10 in the form of phase. The phase of the pole at the output terminal of the VCO 40 is represented as an integration form of frequencies.

A method to design a clock generator based on DLL uses a voltage-controlled delay line (VCDL) instead of VCO. In this method, the pole is only generated by the capacitor comprising the loop filter because the phase is compared and controlled. Thus, a one-pole system can be implemented in this method. However, there is a limit in applying this method to wide range of frequencies.

SUMMARY OF THE INVENTION

The present invention has been made to solve the aforementioned problems and accordingly, it is a feature of the present invention to provide a PLL-based clock generator that has one pole and is able to improve the period jitter characteristic.

It is another feature of the present invention to provide a method for generating a clock based on a PLL capable of improving the period jitter.

According to one aspect of the present invention, a clock generator comprises a phase detector, a charge pump, a loop filter, a voltage-controlled oscillator, and a phase error compensating circuit. The phase detector receives an input clock signal and a feedback signal. The phase detector compares phases of the input clock signal and the feedback signal, and generates a phase detection signal and a phase error signal. The charge pump receives the phase detection signal, and generates a loop control voltage under the control of the phase detection signal. The loop filter filters the loop control voltage, and generates an integrated voltage signal. The voltage-controlled oscillator receives the integrated voltage signal, and generates multi-phase output signals under the control of the integrated voltage signal. The phase error compensating circuit receives the phase error signal and the multi-phase output signals, and detects an amount of phase error contained in the phase error signal using the multi-phase output signals. The phase error compensating circuit also outputs the feedback signal, and compensates a phase error generated at a prior input clock pulse.

In one embodiment, a divider is disposed between the phase error compensating circuit and the phase detector for dividing a frequency of the feedback signal.

The phase error compensating circuit can include: a sampler for receiving the phase error signal, the multi-phase output signals, and a multi-phase control signals, detecting an amount of a phase error contained in the phase error signal using the multi-phase output signals under the control of the multi-phase control signals, and generating a first output signal, a second output signal, and an up/down signal; and a control circuit for receiving the first output signal, the second output signal, and the up/down signal from the sampler, and generating the multi-phase control signals for decreasing the multi-phase output signals sequentially when the up/down signal is in a first logic state and increasing the multi-phase output signals sequentially when the up/down signal is in a second logic state.

In one embodiment, the feedback signal is the first output signal.

The control circuit can include: an adder for receiving the second output signal from the sampler, performing an adding operation, and generating a summation signal; a programmable counter for receiving the summation signal and the first output signal of the sampler, and generating a load signal; and a decision counter for receiving the up/down signal, the load signal, and the first output signal of the sampler, and generating the multi-phase control signals. In one embodiment, a final output clock signal of the clock generator is an output signal of the voltage-controlled oscillator.

The clock generator according to the present invention may include an interpolator in the voltage-controlled oscillator for segmenting the multi-phase output signals.

According to another aspect of the present invention, a method for generating a clock comprises generating a phase detection signal and a phase error signal by comparing phases of an input clock signal and a feedback signal, receiving the phase detection signal and generating a loop control voltage under the control of the phase detection signal, filtering the loop control voltage and generating an integrated voltage signal, receiving the integrated voltage signal and generating multi-phase output signals under the control of the integrated voltage signal, receiving the phase error signal and the multi-phase output signals, detecting an amount of phase error contained in the phase error signal using the multi-phase output signals, outputting the feedback signal, and compensating a phase error generated at a prior input clock pulse.

In one embodiment, frequency of the feedback signal is divided.

In one embodiment, compensating the phase error includes: receiving the phase error signal, the multi-phase output signals, and multi-phase control signals, detecting an amount of phase error contained in the phase error signal using the multi-phase output signals under the control of the multi-phase control signals, and generating a first output signal, a second output signal, and an up/down signal; and receiving the first output signal, the second output signal, and the up/down signal, and generating the multi-phase control signals for decreasing the multi-phase output signals sequentially when the up/down signal is in a first logic state and increasing the multi-phase output signals sequentially when the up/down signal is in a second logic state. The feedback signal can be the first output signal.

Generating the multi-phase control signals can include: receiving the second output signal, performing an adding operation, and generating a summation signal; receiving the summation signal and the first output signal, and generating a load signal; and receiving the up/down signal, the load signal, and the first output signal, and generating the multi-phase control signals. The clock generator according to the present invention has one pole and has an improved period jitter characteristic.

DESCRIPTION OF THE PREFERRED EMBODIMENTS

Figure 2:
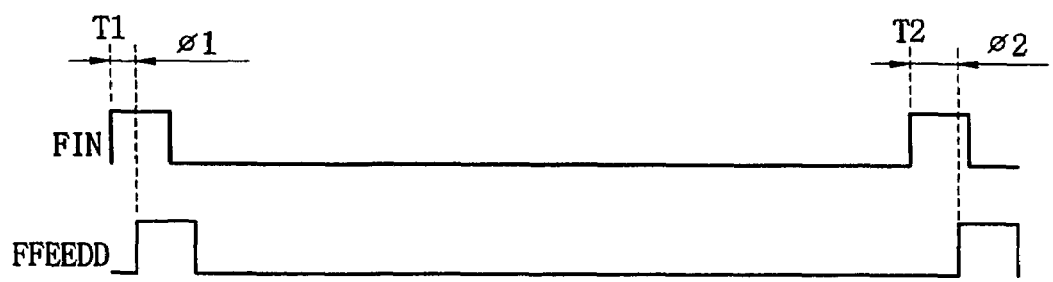
FIG. 2 is a timing diagram illustrating a phase relation between the input clock of a clock generator and the feedback signal.

FIG. 2 is a timing diagram illustrating a phase relation between the input clock of a clock generator and the feedback signal. Referring to FIG. 2, a phase error Φ 1 generated at T1 appears at T2, so that Φ 2 is represented as Φ 2=Φ 1+delta Φ 2. Here, when the error of Φ 1 is compensated, Φ 2 can be expressed as Φ 2=delta Φ 2.

Figure 3:
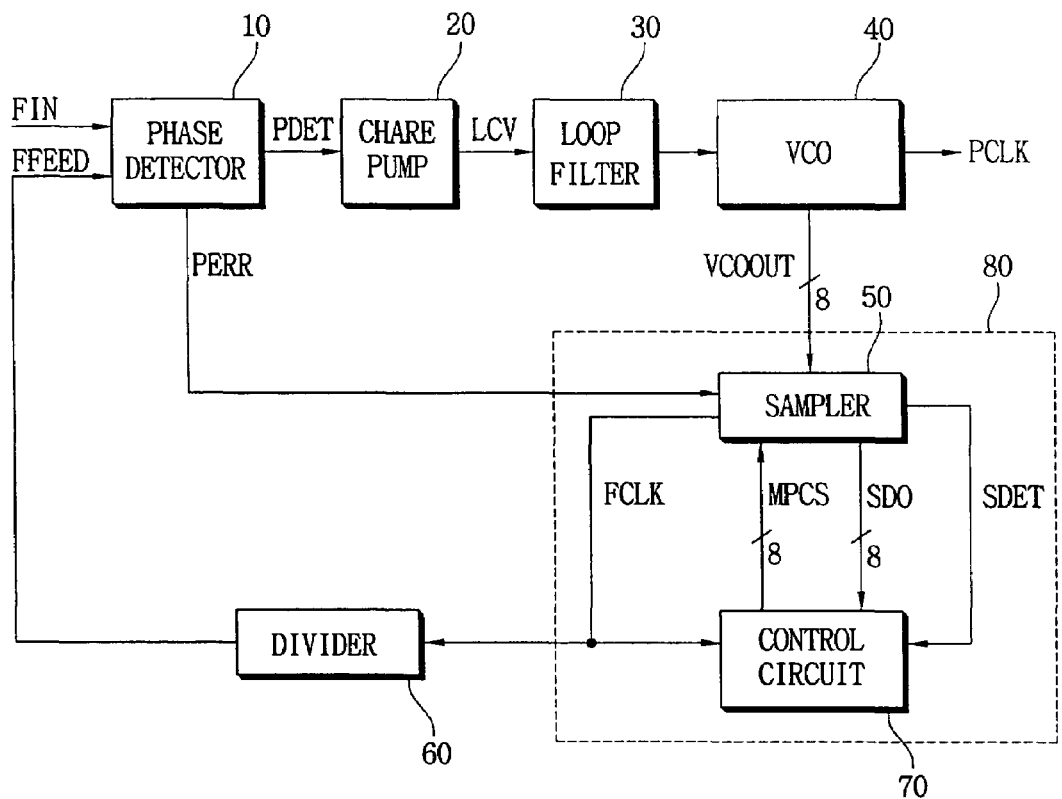
FIG. 3 is a block diagram illustrating a PLL-based clock generator according to one exemplary embodiment of the present invention.

FIG. 3 is a block diagram illustrating a PLL-based clock generator according to one exemplary embodiment of the present invention. Referring to FIG. 3, the circuit includes a phase detector 10, a charge pump 20, a loop filter 30, a VCO 40, a sampler 50, a divider 60, and a control circuit 70.

The phase detector 10 receives an input clock signal FIN and a feedback signal FFEED, compares phases of the input clock signal and the feedback signal, and generates a phase detection signal PDET and a phase error signal PERR. The charge pump 20 receives the phase detection signal and generates a loop control voltage LCV under the control of the phase detection signal. The loop filter 30 filters the loop control voltage and generates an integrated voltage signal. The VCO 40 receives the integrated voltage signal and generates multi-phase output signals under the control of the integrated voltage signal. The phase error compensating circuit 80 receives the phase error signal PERR and the multi-phase output signals VCOOUT, detects an amount of a phase error contained in the phase error signal PERR using the multi-phase output signals VCOOUT, outputs the signal FCLK, and compensates a phase error generated at a prior input clock pulse T1 in FIG. 2. The divider 60 is located between the phase error compensating circuit 80 and the phase detector 10 and divides a frequency of the output signal FCLK of the phase error compensating circuit 80.

The phase error compensating circuit 80 includes a sampler 50 and a control circuit 70. The sampler 50 receives the phase error signal PERR, the multi-phase output signals VCOOUT, and multi-phase control signals MPCS, and detects an amount of phase error contained in the phase error signal PERR using the multi-phase output signals VCOOUT under the control of the multi-phase control signals MPCS. The sampler 50 further generates a first output signal FCLK, a second output signal SDO, and an up/down signal SDET. The control circuit 70 receives the first output signal FCLK, the second output signal SDO, and the up/down signal SDET from the sampler 50, and generates the multi-phase control signals MPCS. The multi-phase control signals MPCS decrease the multi-phase output signals VCOOUT sequentially when the up/down signal SDET is in a first logic state and increase the multi-phase output signals VCOOUT sequentially when the up/down signal SDET is in a second logic state.

Figure 4:
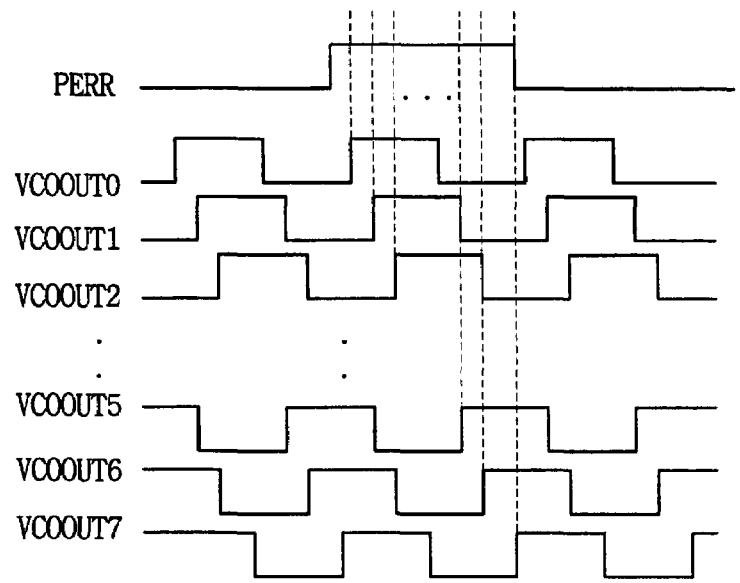
FIG. 4 is a timing diagram illustrating a phase relation between the input signal and the output signal of the sampler shown in FIG. 3.

FIG. 4 is a timing diagram illustrating a phase relation between the input signal and the output signal of the sampler shown in FIG. 3.

Referring to FIGS. 3 and 4, the operation of a clock generator according to one exemplary embodiment of the present invention will be described.

The output of the VCO 40 is sampled and changed to a signal having a low frequency in a divider 60. Then, this signal passes through a phase detector 10, a charge pump 20, and a loop filter 30, and is fed back to an input terminal of the VCO 40. The output signal FFEED of the divider 60 is inputted to one input terminal of the phase detector 10. The clock input signal FIN is inputted to another input terminal of the phase detector 10. The phase detection signal PDET is changed to a loop control signal LCV, and is inputted to the loop filter 30. The loop filter 30 performs integration, and sets a bandwidth of the circuit. The output of the loop filter 30 is input to an input terminal of the VCO 40. The VCO 40 generates multi-phase output signals VCOOUT of 8 bits.

The sampler 50 receives a phase error signal PERR, and detects the amount thereof. A first output FCLK of the sampler 50 is applied to the divider 60 and the control circuit 70. The amount of the phase error signal PERR is detected with the resolution of a phase difference of the multi-phase output VCOOUT. The number of the outputs of the VCO 40 determines the resolution of error detection. A second output SDO of the sampler is applied to the control circuit 70. Further, the sampler 50 generates an up/down signal SDET for directing whether the output of the VCO 40 should be increased or decreased considering the amount of the detected error signal. For example, when the up/down signal SDET is "1", it is an "up" signal and when the up/down signal SDET is "0", it is a "down" signal. The sampler 50 receives a multi-phase control signal MPCS from the control circuit 70.

Figure 5:
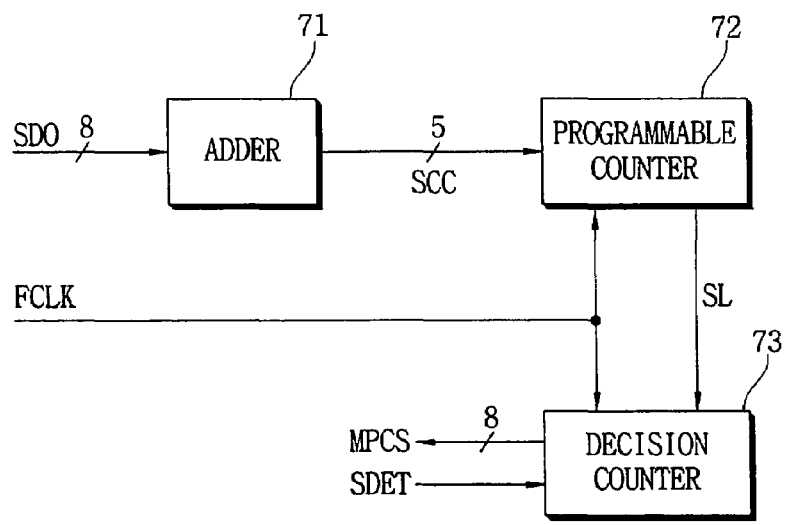
FIG. 5 is a block diagram illustrating the control circuit shown in FIG. 3.

FIG. 5 is a block diagram illustrating the control circuit shown in FIG. 3.

Referring to FIG. 5, the control circuit 70 comprises an adder 71, a programmable counter 72, and a decision counter 73.

The adder 71 receives the second output signal SDO from the sampler 50, performs an adding operation, and generates a summation signal SCC. The programmable counter 72 receives the summation signal SCC and the first output signal FCLK of the sampler 50, and generates the load signal SL.

The decision counter 73 receives the up/down signal SDET, the load signal SL, and the first output signal FCLK of the sampler 50, and generates the multi-phase control signal MPCS.

Hereinafter, the operation of the control circuit 70 will be described.

The adder 71 receives a second output SDO of the sampler 50, and adds the number of the data bits that are logic "1". As a result, the number of the data bits that are logic "1" is the same as the amount of a phase error. The programmable counter 72 receives the output SCC of the adder 71, and outputs the load signal SL. The load signal controls the decision counter 73.

The decision counter 73, which is comprised of a swallow counter and a decision logic circuit (not shown), operates when the load signal SL is logic "1" and remains in a current state when the load signal SL is logic "0". The swallow counter controls so that the multi-phase outputs VCOOUT of the VCO 40 are outputted as a first output signal FCLK of the sampler 50. In case the up/down signal SDET generated in the sampler 50 is logic "1", the decision counter 73 sequentially decreases the final output of the VCO 40. In case the up/down signal SDET is logic "0", the decision counter 73 sequentially increases the final output of the VCO 40.

Figure 1:
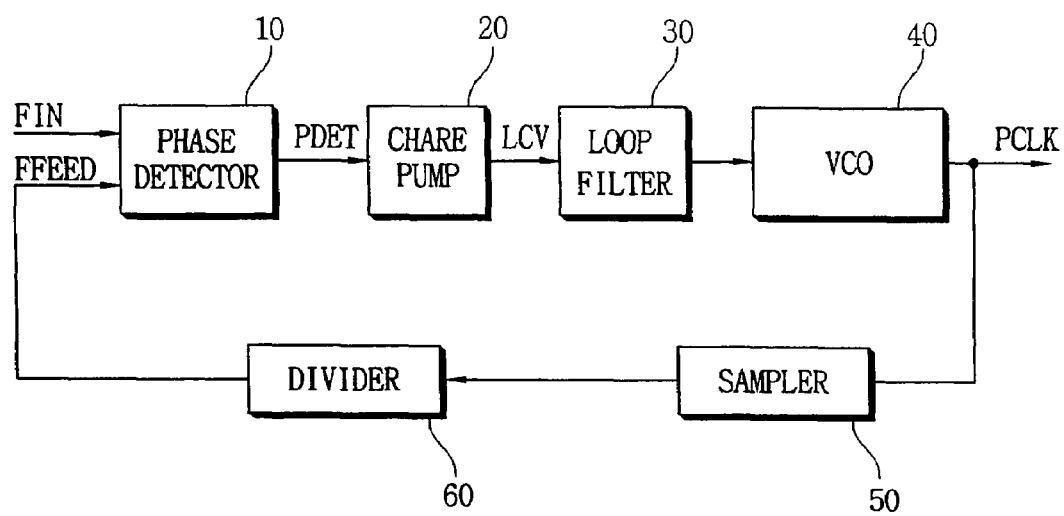
FIG. 1 is a block diagram illustrating a conventional PLL-based clock generator.

A final output among the multi-phase output signals VCOOUT controlled as above is input to the divider 60 in FIG. 3 and a phase error Φ1 in FIG. 1 generated at T1 is compensated by a robust method. As a result, the clock generator operates as a 1-pole system. As the final output of the clock generator directly uses the output clock of the VCO 40 in FIG. 3 instead of the clock applied to the input terminal of the divider 60 in FIG. 3, the increase of the period jitter generated by an input jitter and by a logic control can be prevented.

Figure 6:
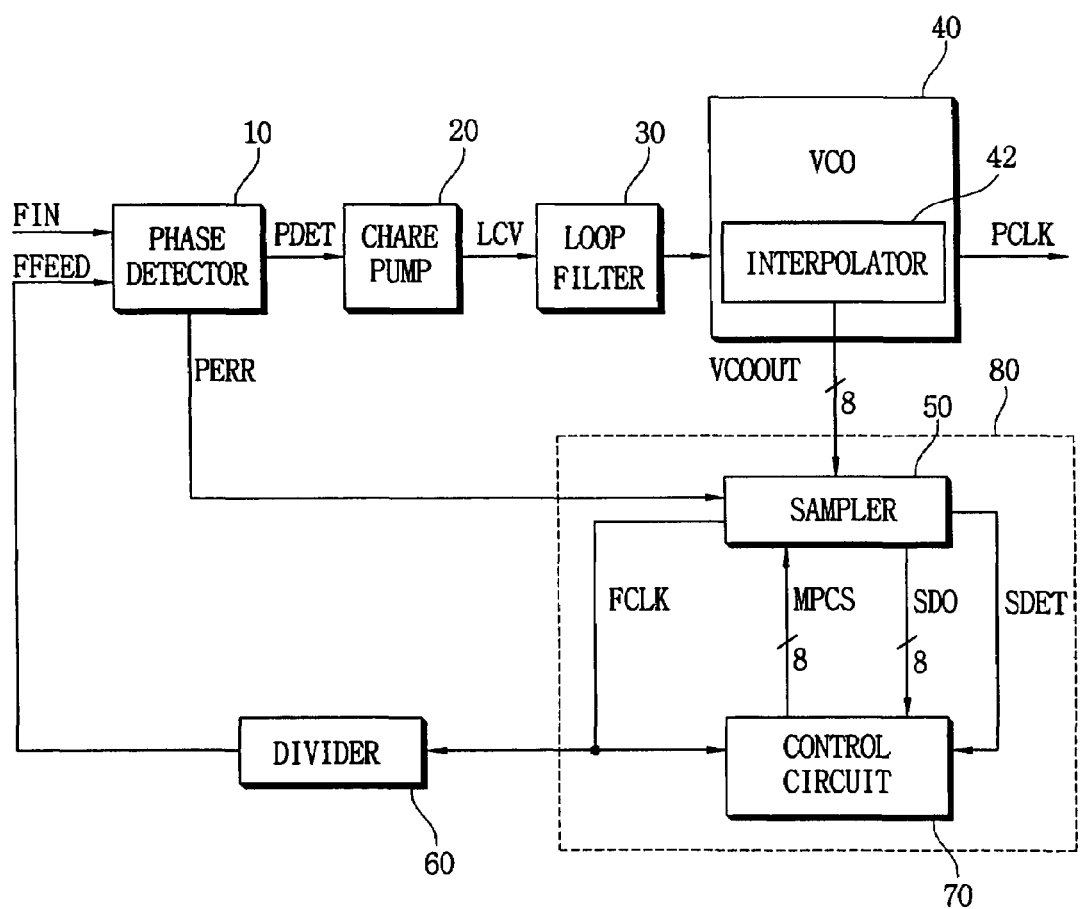
FIG. 6 is a block diagram illustrating a PLL-based clock generator according to another exemplary embodiment of the present invention.

FIG. 6 is a block diagram illustrating a PLL-based clock generator according to another exemplary embodiment of the present invention. The clock generator of FIG. 6 further includes an interpolator 42 in the VCO 40 in comparison with the clock generator of FIG. 3. By inserting the interpolator 42 in the VCO 40, the output of the VCO 40 can be segmented such that the output of the VCO 40 has various bits of phases.

Except the addition of the interpolator 42 in the VCO 40, the structure of the clock generator of FIG. 6 is the same as that of the clock generator of FIG. 3. Accordingly, the description will not be repeated.

Figure 7:
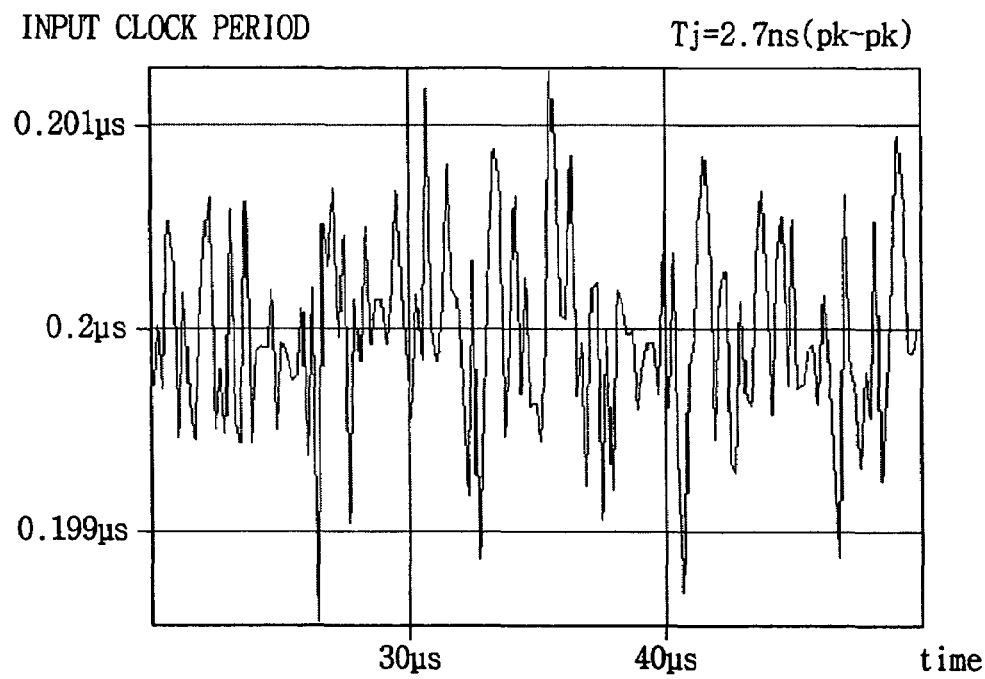
FIG. 7 is a plot showing the period of an input clock with jitter.

The condition of the simulation is in accordance with the following.

input frequency: 5 MHz (2.7 ns(pk-pk), apply random jitter)
output frequency: 200 MHz
pump current (Ip): 20 uA
VCO Gain (Kvco): 480 MHz/Volt
loop filter (conventional clock generator): (Wc(BW)=1/10*Win), main capacitor - - - 97 pF, ripple capacitor - - - 9.7 pF, resistor - - - 13 kΩ
loop filter (clock generator of this invention): main capacitor - - - 97 pF FIG. 7 is a plot showing the period of an input clock with jitter. The period jitter of an input clock is the difference between the maximum value and the minimum value of the input clock period and is about 2.7 ns(pk-pk) as shown in FIG. 7.

Figure 8A:
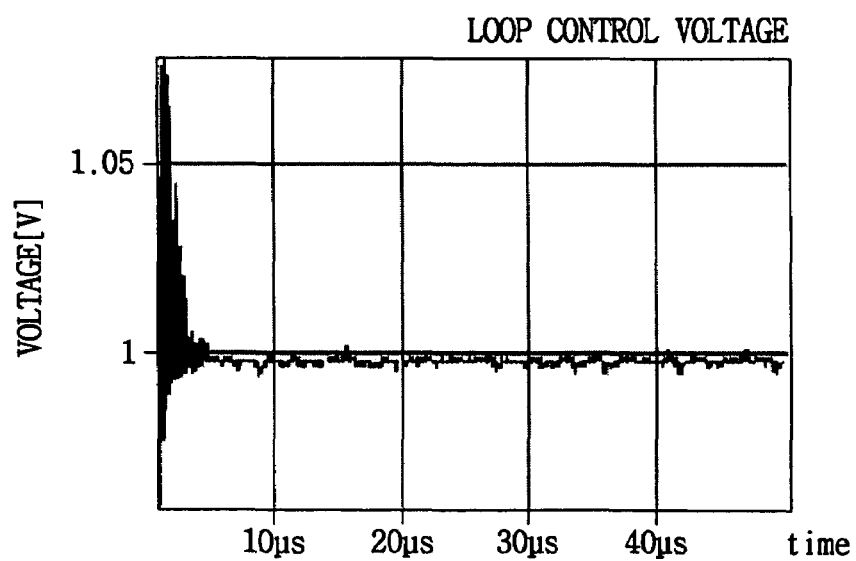
FIGS. 8A to 8C are simulation plots of a PLL-based clock generator according to conventional art shown in FIG. 1.
Figure 8B:
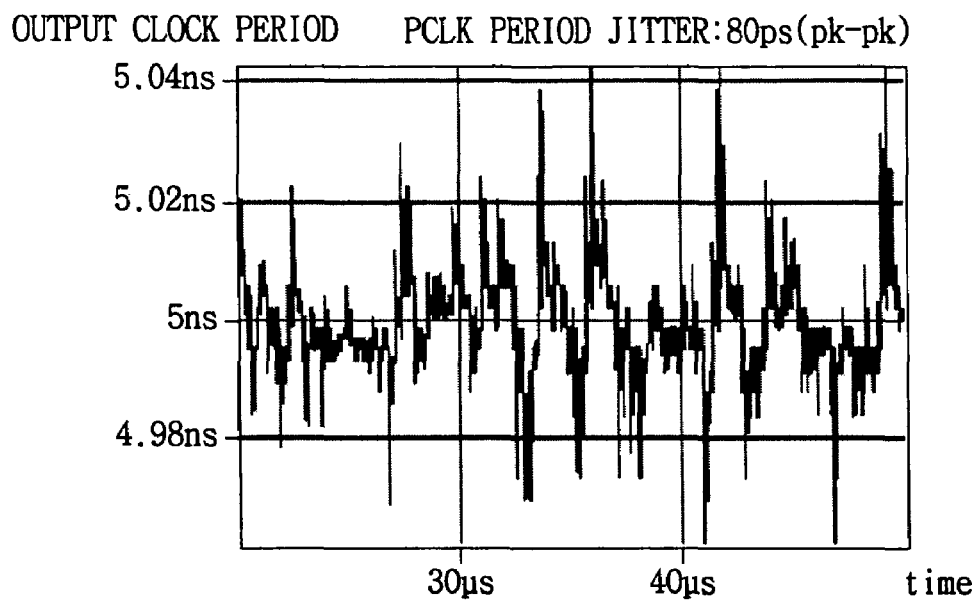
Figure 8C:
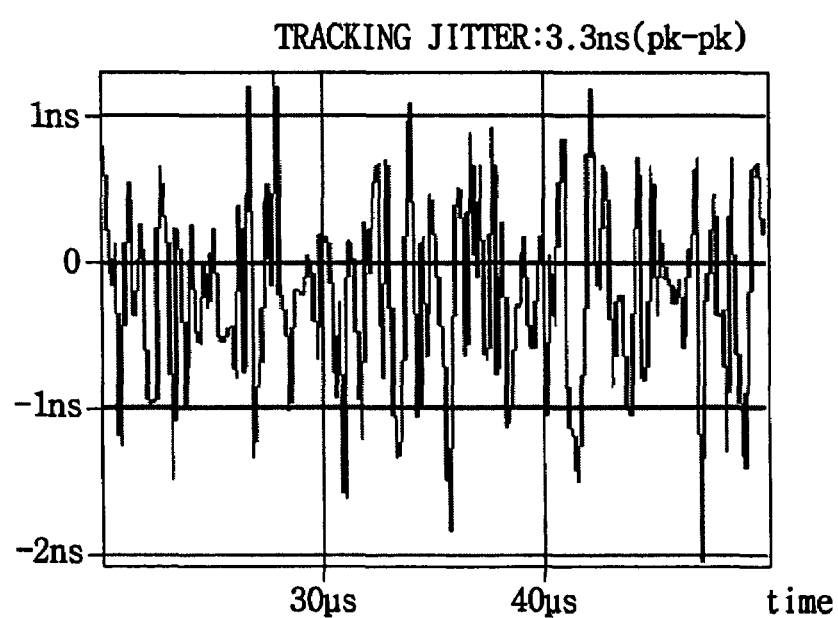

FIGS. 8A to 8C are simulation plots of a PLL-based clock generator according to a conventional art shown in FIG. 1.

FIG. 8A is the waveform of a loop control voltage LCV in FIG. 1, and represents the stability of a clock generator. As shown in FIG. 8A, the clock generator has a stable characteristic. FIG. 8B represents the period jitter of an output clock. The period jitter of an output clock is the difference between the maximum value and the minimum value of the output clock period and is about 80 ps(pk-pk) as shown in FIG. 8B. This means that the characteristic of a period jitter is degraded by the ripple introduced to the system by a zero. FIG. 8C represents the tracking jitter of a prior art clock generator. The tracking jitter is the clock jitter measured at the output when the input clock with jitter is applied and is 3.3 ns(pk-pk) as shown in FIG. 8C. The tracking jitter of the prior art clock generator has a stable characteristic when compared with the input clock.

Figure 9A:
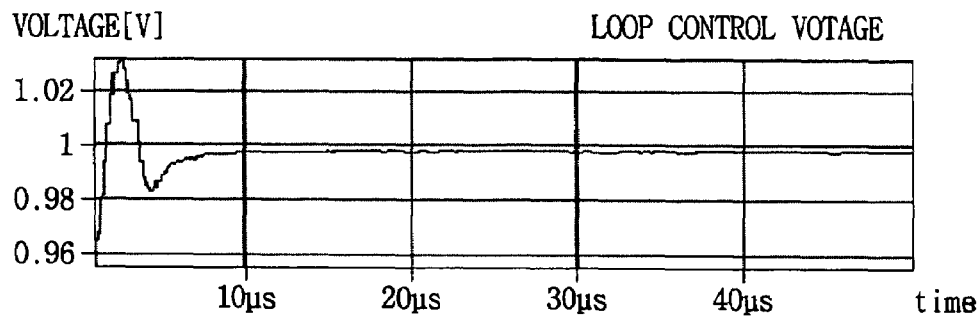
FIGS. 9A to 9C are simulation plots of a PLL-based clock generator according to the present invention.
Figure 9B:
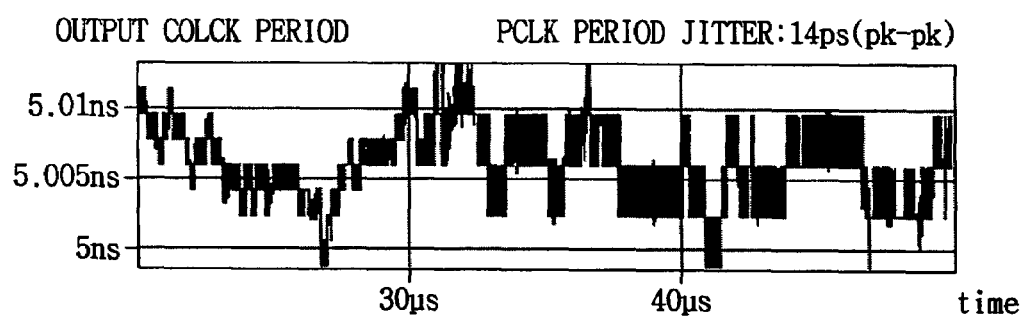
Figure 9C:
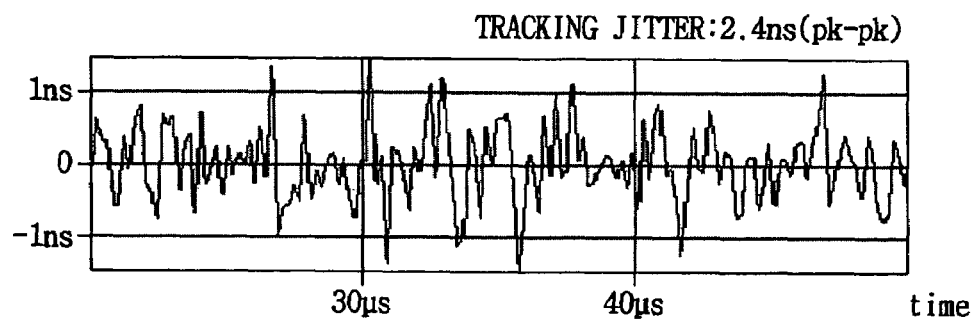

FIGS. 9A to 9C are simulation plots of a PLL-based clock generator according to the present invention. As shown in FIG. 9A, it can be noted that the loop control voltage has a constant value around 1 V and the clock generator shows a stable characteristic. As shown in FIG. 9B, it can be noted that the period jitter of the output clock is 14 ps(pk-pk), and is one sixth of the period jitter of an output clock of the conventional clock generator of FIG. 1. The reason for this is that the clock generator of this invention is a 1-pole system, and does not generate the ripple due to a zero added to the system, unlike the conventional clock generator. As shown in FIG. 9C, the tracking jitter is 2.4 ns(pk-pk), and represents a stable characteristic.

It is noted that modifications and variations can be made by persons skilled in the art in light of the above teachings. It is therefore to be understood that changes may be made in the particular embodiment of the present invention disclosed which is within the scope and the spirit of the invention outlined by the appended claims.

What is claimed is:

1. A clock generator comprising:
   a phase detector for receiving an input clock signal and a feedback signal, comparing phases of the input clock signal and the feedback signal, and generating a phase detection signal and a phase error signal;
   a charge pump for receiving the phase detection signal and generating a loop control voltage under the control of the phase detection signal;
   a loop filter for filtering the loop control voltage and generating an integrated voltage signal;

a voltage-controlled oscillator for receiving the integrated voltage signal and generating multi-phase output signals under the control of the integrated voltage signal; and a phase error compensating circuit for receiving the phase error signal and the multi-phase output signals, detecting a size of the phase error signal using the multi-phase output signals, outputting the feedback signal, and compensating a phase error generated at a prior input clock pulse.

2. The clock generator of claim 1, further comprising a divider between the phase error compensating circuit and the phase detector for dividing a frequency of the feedback signal.

3. The clock generator of claim 1, wherein the phase error compensating circuit includes:

a sampler for receiving the phase error signal, the multi-phase output signals, and multi-phase control signals, detecting the size of the phase error signal using the multi-phase output signals under the control of the multi-phase control signals, and generating a first output signal, a second output signal, and an up/down signal; and a control circuit for receiving the first output signal, the second output signal, and the up/down signal from the sampler, and generating the multi-phase control signals for decreasing the multi-phase output signals sequentially when the up/down signal is in a first logic state and increasing the multi-phase output signals sequentially when the up/down signal is in a second logic state.

4. The clock generator of claim 3, wherein the feedback signal is the first output signal.

5. The clock generator of claim 3, wherein the control circuit includes:

an adder for receiving the second output signal from the sampler, performing an adding operation, and generating a summation signal;

a programmable counter for receiving the summation signal and the first output signal of the sampler, and generating a load signal; and a decision counter for receiving the up/down signal, the load signal, and the first output signal of the sampler, and generating the multi-phase control signals.

6. The clock generator of claim 1, wherein the voltage-controlled oscillator includes an interpolator for segmenting the multi-phase output signals.

7. The clock generator of claim 1, wherein a final output clock signal of the clock generator is an output signal of the voltage-controlled oscillator.

8. A method for generating a clock comprising:

generating a phase detection signal and a phase error signal by comparing phases of an input clock signal and a feedback signal;

receiving the phase detection signal and generating a loop control voltage under the control of the phase detection signal;

filtering the loop control voltage and generating an integrated voltage signal; receiving the integrated voltage signal and generating multi-phase output signals under the control of the integrated voltage signal; and receiving the phase error signal and the multi-phase output signals, detecting a size of the phase error signal using the multi-phase output signals, outputting the feedback signal, and compensating a phase error generated at a prior input clock pulse.

9. The method for generating a clock of claim 8, further comprising dividing a frequency of the feedback signal.

10. The method for generating a clock of claim 8, wherein compensating the phase error includes:

receiving the phase error signal, the multi-phase output signals, and multi-phase control signals, detecting a size of the phase error signal using the multi-phase output signals under the control of the multi-phase control signals, and generating a first output signal, a second output signal, and an up/down signal; and receiving the first output signal, the second output signal, and the up/down signal, and generating the multi-phase control signals for decreasing the multi-phase output signals sequentially when the up/down signal is in a first logic state and increasing the multi-phase output signals sequentially when the up/down signal is in a second logic state.

11. The method for generating a clock of claim 10, wherein the feedback signal is the first output signal.

12. The method for generating a clock of claim 10, wherein generating the multi-phase control signals includes:

receiving the second output signal, performing an adding operation, and generating a summation signal;

receiving the summation signal and the first output signal, and generating a load signal; and receiving the up/down signal, the load signal, and the first output signal, and generating the multi-phase control signals.

* * * * *